United States Patent [19]
Gardner

[11] Patent Number: 6,051,486
[45] Date of Patent: *Apr. 18, 2000

[54] METHOD AND STRUCTURE FOR REPLACEABLE GATE ELECTRODE IN INSULATED GATE FIELD EFFECT TRANSISTORS

[75] Inventor: Mark I. Gardner, Cedar Creek, Tex.

[73] Assignee: Advanced Micro Devices, Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/993,387

[22] Filed: Dec. 18, 1997

[51] Int. Cl.⁷ .................................................. H01L 21/3205
[52] U.S. Cl. ........................ 438/585; 438/183; 438/197; 438/586
[58] Field of Search ...................................... 257/751, 753, 257/763, 769, 770; 438/585, 586, 587, 595, 183, 184, 588, 197, 199

[56] References Cited

U.S. PATENT DOCUMENTS

| | | | |
|---|---|---|---|
| 4,141,022 | 2/1979 | Sigg et al. | |
| 4,455,738 | 6/1984 | Houston et al. | 438/183 |
| 4,685,194 | 8/1987 | Cricchi et al. | 438/294 |
| 4,745,082 | 5/1988 | Kwok | 438/183 |
| 4,782,031 | 11/1988 | Hagio et al. | 438/183 |
| 4,784,718 | 11/1988 | Mitani et al. | 438/183 |
| 4,814,854 | 3/1989 | Tigelaar et al. | |
| 5,168,072 | 12/1992 | Moslehi | 438/300 |
| 5,474,947 | 12/1995 | Chang et al. | 438/257 |
| 5,585,302 | 12/1996 | Li | 438/384 |
| 5,648,678 | 7/1997 | Begley et al. | |
| 5,714,398 | 2/1998 | Chao et al. | 438/303 |
| 5,858,843 | 1/1999 | Doyle et al. | 438/183 |

*Primary Examiner*—Carl Whitehead, Jr.
*Assistant Examiner*—Khanh Duong

[57] ABSTRACT

A method and structure are provided for an IGFET which has a replaceable gate electrode fabrication and dual polished fabrication technique to simultaneously form source, drain and gate regions. The IGFET provides a raised metal layer between the source/drain areas and subsequent metallization layers. The IGFET provides a second gate material formed from a refractory metal which creates a gate junction with low contact resistivity. The refractory metal gate and the metal layer are formed over the source and drain regions in the same process step. The metal layer and replaceable gate are scalable. Also, by first having a first gate material, which is subsequently removed, the fabrication process can continue to utilize self-aligned processing. An information handling system which incorporates the above method and structure is similarly provided.

20 Claims, 3 Drawing Sheets

METHOD AND STRUCTURE FOR REPLACEABLE GATE ELECTRODE IN INSULATED GATE FIELD EFFECT TRANSISTORS

RELATED APPLICATIONS

This application is related to the co-filed and commonly assigned application entitled "Method and structure for elevated source/drain with polished gate electrode in insulated gate field effect transistors," (U.S. Ser. No. 08/993,388 filed Dec. 18, 1997) which is hereby incorporated by reference.

FIELD OF THE INVENTION

The present invention relates generally to semiconductor integrated circuits. More particularly, it pertains to a method and structure for replaceable gate electrode fabrication with a dual polished fabrication technique to simultaneously form source, drain and gate regions.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by an insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

Several objectives influence IGFET design and fabrication. First, there is a desire to reduce the dimensions of the IGFET. Increasing the number of individual IGFETs that can be placed onto a single silicon chip or die produces increased functionality per chip. Second, there is a continual desire to improve performance, and particularly the speed, of the IGFET transistors. This pursuit is manifested in shorter conduction channel lengths and in efforts to obtain low contact resistivity at the IGFET junctions. These aspects offer increased IGFET speed and allow for a greater number of operations to be performed by the IGFET in less time. IGFETs are used in great quantity in computers where the push to obtain higher operation cycle speeds demands faster IGFET performance. Lastly, there exists a constant need to maintain costly IGFET fabrication steps at a minimum.

As the feature dimensions of the IGFET device decrease, new performance hurdles present themselves. One particular difficulty, concerns the contact resistance between the IGFET and different metallization layers. Contact resistance is influenced by the materials, the substrate, doping and the contact dimensions. Refractory metals and their silicides offer lower contact resistance but have other limitations, such as their use in self-aligned process techniques. Refractory metals are popular for filling via holes, a process known as plug filling, in multi-level metal structures. Polysilicon, on the other hand, has been more popular for use as gate contact due to its utility in producing "self-aligned" source/drain regions. A gate formed from polysilicon structure will serve as a mask whereby the subsequent source/drain doping aligns the dopants next to the gate. Polysilicon is also well suited for the salicidation process where self-alignment technique is combined with an additional layer of a refractory metal silicide. The silicide is formed by reaction of the refractory metal with the underlying polysilicon through an alloy step. There have been serious efforts on the use of tungsten and other refractory metal gates as a mask in a self-aligned process. However, even though these metals tolerate high temperatures, their thermal budget tends to limit anneal temperatures for the source/drain implants.

A continual need exists for creating improved junctions between the IGFET structures and subsequent metallization layers. Thus, it is desirable to produce source and drain junctions which are scalable in size and material in order to improve contact resistance. It is also desirable to form gates which offer decreased contact resistivity. Further, a method is desirable to achieve the above mentioned results while keeping costly fabrication steps to a minimum.

SUMMARY OF THE INVENTION

A method for forming a device which has replaceable gate electrode fabrication with a dual polished fabrication technique to simultaneously form source, drain and gate regions is provided. The method of fabrication includes forming a transistor. The transistor includes a first gate material, with opposing sides, on the surface of a gate oxide. A source region and a drain region are provided. A pair of dielectric spacers are disposed adjacent to the opposing sides of the first gate material. The first gate material having a high selectivity to the gate oxide and to the dielectric spacers. The method of fabrication includes removing the first gate material and depositing a metal layer.

In one embodiment, depositing a metal layer comprises depositing a refractory metal directly on the gate oxide to serve as a second gate material subsequent to the removal of the first gate material. The first gate material is nitride and is removed by reactive ion etching (RIE).

A device is provided which has replaceable gate electrode fabrication with a dual polished fabrication technique to simultaneously form source, drain and gate regions. The device includes a transistor on a semiconductor substrate. The transistor has a second gate material (gate) formed of a refractory metal which has opposing sides. The second gate material is formed subsequent to removing a first gate material. The second gate material of the transistor is formed over a gate oxide. The transistor has a source region and a drain region. A pair of dielectric spacers are disposed adjacent to opposing sides of the gate. A metal layer is provided on the source and drain regions. In one embodiment, the second gate material is formed by removing a nitride layer from a top surface of the gate oxide and then depositing in its place a refractory metal. A lightly doped drain region and a lightly doped source region underneath the dielectric spacers.

An information handling system is also provided which includes the above device. The system has a central processing unit, a random access memory; and a system bus for coupling the central processing unit to the random access memory. As stated, the system includes the above device along with each of its features. Those features include a transistor on a semiconductor substrate. The transistor has a second gate material (gate) which has opposing sides, is formed of a refractory metal, and is position over a gate oxide. The second gate material is formed subsequent to removing a first gate material. The transistor has a source region and a drain region. A pair of dielectric spacers are disposed adjacent to opposing sides of the gate. A metal layer is provided on the source and drain regions.

Thus an improved IGFET is provided which offers a raised metal layer between the source/drain areas and subsequent metallization layers. The metal layer is scalable. In one embodiment the metal is a refractory metal silicide. A refractory metal gate is provided without sacrificing the fabrication advantage of self-aligned techniques. A method to produce an IGFET which incorporates both of the above advantages into a single device, with relatively few process steps, is also provided.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Method of Fabrication

Figure 1A:
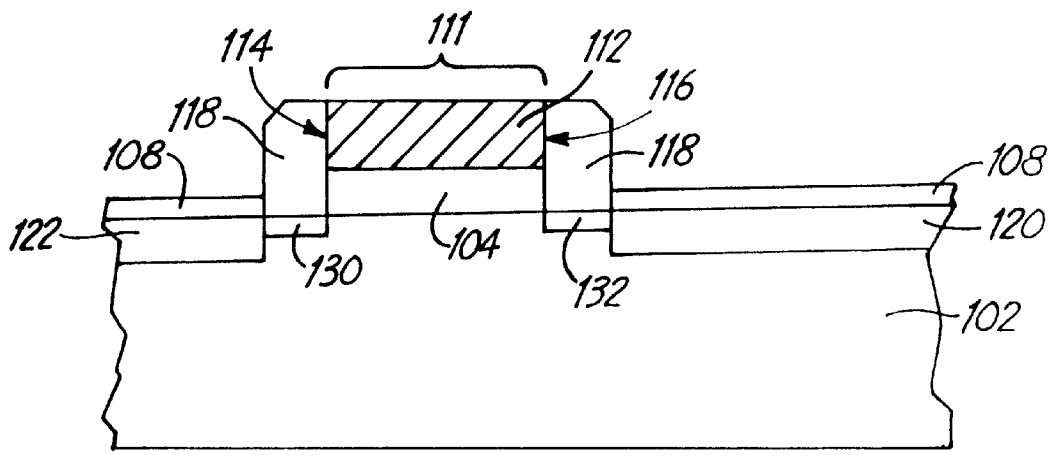
FIGS. 1A–1B show cross-sectional views of successive process steps for making an IGFET with replaceable gate electrode fabrication with a dual polished fabrication technique to simultaneously form source, drain and gate in accordance with an embodiment of the invention.
Figure 1B:
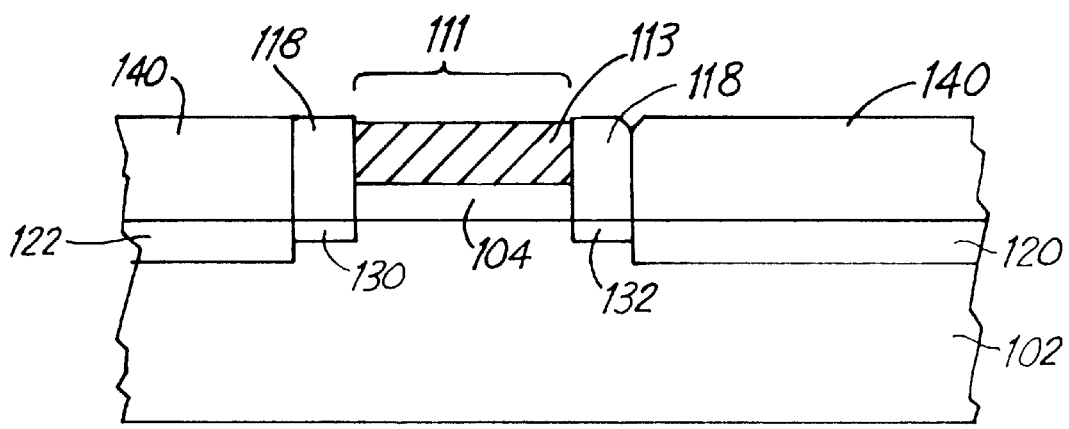

FIGS. 1A–1B, describe generally various processing techniques of one embodiment of an IGFET with a replaceable gate electrode fabrication and dual polished fabrication technique to simultaneously form source, drain and gate regions.

In FIG. 1A, illustrates the structure at the point where the transistor fabrication has been completed through light doped source/drain (LDD) spacer formation and anneal process. FIG. 1A is the starting point for illustrating an embodiment of the fabrication process for the invention. This stage in the fabrication may be reached in a myriad of steps which do not comprise the thrust of the present invention. These processing steps are not repeated herein. Reference is made to a co-filed and commonly assigned application entitled "Method and Structure for Channel Length Reduction in Insulated Gate Field Effect Transistors," (U.S. Ser. No. 08/993,767, now U.S. Pat. No. 5,929,496, issued on Jul. 27, 1999 as one such approach to arriving at this structure. That application is hereby incorporated by reference.

In FIG. 1A a first gate material 112 is shown formed on a gate oxide 104. The first gate material 112 has opposing side, 114 and 116 respectively. In one embodiment, the first gate material is made of nitride. A pair of dielectric spacers 118 are disposed adjacent to the opposing sides, 114 and 116, of the first gate material 112. In an alternative embodiment, the first gate material 112 is made of any material a high selectivity to the gate oxide 104 and the pair of dielectric spacers 118. The first gate material 112 and the gate oxide 104 are shown formed on a top surface of a semiconductor substrate 102. The gate oxide includes any suitable oxide, such as silicon dioxide ($SiO_2$). The upper surface of the substrate 102 is an epitaxial layer suitable for integrated circuit manufacture. In one embodiment the substrate 102 is a P-type substrate with a boron background concentration on the order of $1 \times 10^{16}$ atoms/cm$^3$, a <100> orientation and a resistivity of 12 ohm-cm. Preferably, the epitaxial surface layer of the substrate 102 is disposed on a P+ base layer (not shown) and includes a planar top surface. In an alternative embodiment, the substrate 102 is an N-type substrate on an N+ base layer.

An oxide layer 108 is formed on the top surface of the substrate 102. The oxide layer is formed through any suitable process, such as by chemical vapor deposition (CVD). In an alternative embodiment, the oxide layer is thermally grown on the substrate 102. A source region 120 and a drain region 122 are provided within the substrate 102. Also, lightly doped source and drain regions, 130 and 132 respectively are formed underneath the pair of dielectric spacers 118. Any desired salicidation steps have been performed on the source and drain regions, 120 and 122 respectively, prior to the deposition of oxide layer 108. The first gate material 112 and the pair of dielectric spacers 118 serve as a mask over the gate region 111. This method allowed for self-alignment of the source and drain regions 120 and 122 respectively.

FIG. 1B illustrates the structure following the remaining sequence of process steps. The first gate material 112 is removed. The first gate material 112 is selective to both the gate oxide material 104 and the pair of dielectric spacers 118. The first gate material is removed using a reactive ion etch process (RIE). In an alternative embodiment, other suitable etching techniques may be employed. The underlying gate oxide 104 is left in place on the surface of the substrate 102. In an alternative embodiment the gate oxide is stripped using a BOE and a new gate oxide is grown or deposited in its place either by thermal growth or CVD. Next, the oxide layer 108 is stripped from the source and drain regions, 120 and 122 respectively. The oxide layer is stripped using any suitable buffered oxide etch process (BOE), such as a hydroflouric acid (HF) and water ($H_2O$).

A refractory metal is deposited to form a new gate 113 in the gate region 111. The refractory metal is deposited by any suitable method, such as by low pressure chemical vapor deposition (LPCVD). A metal layer 140 is formed above the source and drain regions, 120 and 122 respectively. The metal layer 140 is formed by LPCVD or any other suitable method. In one embodiment, the metal layer 140 is formed of a refractory metal and is deposited in the same process step with forming the new gate 113. The pair of dielectric spacers 118 self-align the metal layer 140 over the source and drain regions, 120 and 122, as well as the second gate material 113 over the gate oxide 104. In an alternative embodiment, the metal layer 140 is titanium nitride (TiN). The deposition by the LPCVD process is controllable and scalable to create any desired elevation. The structure is now as illustrated by FIG. 1B. Additional metallization layers and accompanying contact formation, not included here, are achieved using conventional techniques. These further processing steps are not repeated herein. Likewise, the principal processing steps disclosed herein may be combined with other steps apparent to those skilled in the art.

Figure 2:
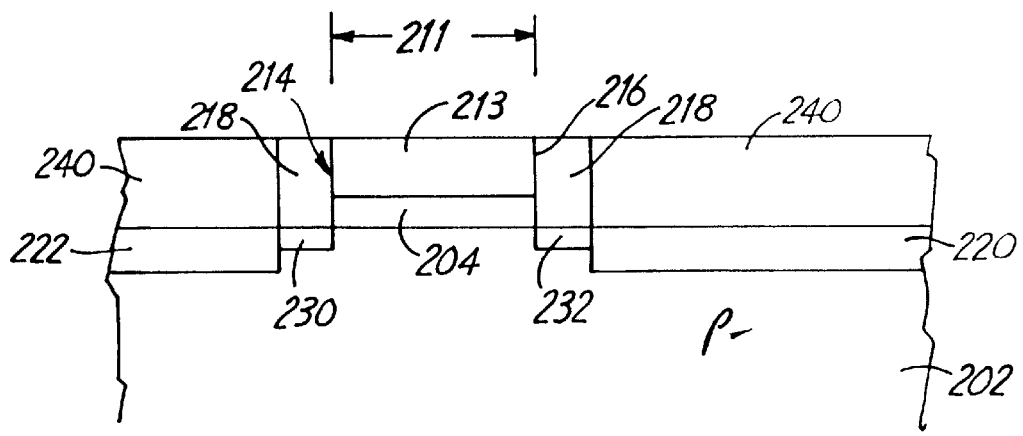
FIG. 2 illustrates the completed IGFET structure in accordance with an embodiment of the invention.

The present invention includes numerous variations to the embodiment described above. For instance, the completed device illustrated in FIG. 2 is one embodiment of the invention formed on a top surface of a semiconductor substrate 202. FIG. 2 is a cross sectional view wherein a second gate material (gate) 213 is formed on a gate oxide 204. The second gate material 213 is formed of a refractory metal and has opposing sides 214 and 216 respectively. The second gate material 213 is formed on the gate oxide 204 subsequent to removing a first gate material (not shown). In one embodiment, the first gate material (not shown) is formed of nitride. A pair of dielectric spacers 218 are disposed adjacent to the opposing sides, 214 and 216, of the second gate material 213. In an alternative embodiment, the first gate material is formed of any material which is highly selective to the gate oxide 204 and the dielectric spacers 218. A source region 220 and a drain region 222 are provided in a manner that is self-aligned using the first gate material (not shown) and the pair of dielectric spacers 218. Lightly doped regions, 230 and 232 respectively, are provided within the substrate 202, beneath the pair of dielectric spacers 218. A metal layer 240 is provided above the source and drain regions, 220 and 222 respectively. The metal layer is formed by low pressure chemical vapor deposition (LPCVD). In one embodiment, the metal layer 240 is formed of a refractory metal. In an alternative embodiment, the metal layer 240 is titanium nitride (TiN). The second gate material 213 was formed by first removing the first gate material (not shown) from the gate oxide 204 and then depositing in its place a refractory metal. Before its removal, the first gate material (not shown) and the pair of dielectric spacers 218 served as a mask to self-align the source and drain regions, 220 and 222 respectively. In one embodiment, the metal layer 240 and the second gate material 213 both are formed of a refractory metal and are deposited in the same process step by LPCVD following the removal of the first gate material (not shown). The pair of dielectric spacers 218 self-align the metal layer 240 over the source and drain regions, 220 and 222, as well as the second gate material 213 over the gate oxide 204. The deposition by the LPCVD process is controllable and scalable to create any desired elevation.

Thus the invention provides a method and structure for an IGFET in which refractory metal silicides or barrier metal layers, such as TiN, are provided to reduce the contact resistance between the IGFET's source and drain junctions and subsequent metallization layers. Also, by first having a nitride layer on the gate oxide 204, the fabrication process can continue to utilize self-aligned processing. The refractory metal deposited as the second gate material creates a gate junction with low contact resistivity.

Figure 3:
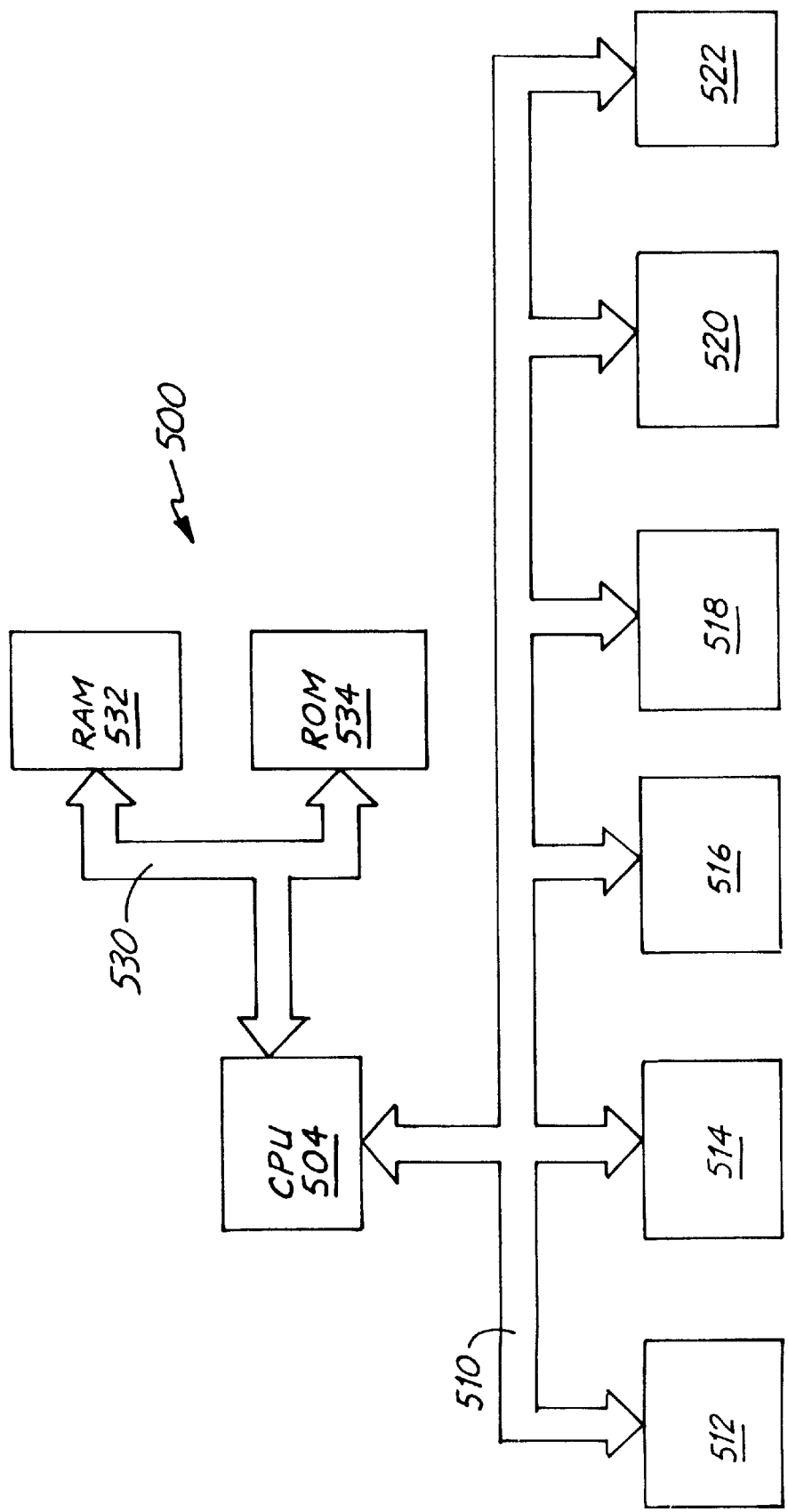
FIG. 3 is a block diagram of an information handling system to incorporate an embodiment of the invention.

Advantageously, the invention is well-suited for use in a device such as an integrated circuit chip, as well as an electronic system including a microprocessor, a memory and a system bus. The electronic system may also be an information handling system 500 as shown in FIG. 3. The information handling system includes a central processing unit 504, a random access memory (RAM) 532, a read only memory (ROM) 534, and a system bus 530 for communicatively coupling the central processing unit 504 and the RAM 532 and the ROM 534. The system 500 also includes an input/output bus 510 and several devices peripheral devices, such as 512, 514, 516, 518, 520, and 522. The device peripherals attach to the input output bus 510. Peripheral devices include hard disk drives, floppy disk drives, monitors, keyboards and other such peripherals. The information handling system 500 includes a device such as is shown in FIG. 2. Low contact resistivity at the junctions between the IGFET device and subsequent metallization layers provides for stronger and more reliable coupling of electronic data throughout the information handling system.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for forming a semiconductor device, the method comprising:

forming a transistor on a semiconductor substrate, including forming a first gate material with opposing sides directly on a gate oxide on the substrate, a source region, a drain region, and a pair of dielectric spacers adjacent to the opposing sides of the first gate material, the first gate material being selective to the gate oxide and to the dielectric spacers;

replacing the first gate material with a second gate material directly on the gate oxide that is different from the first gate material; and depositing a metal layer electrically coupled to and over the source and drain regions.

2. The method, according to claim 1, wherein the metal layer is formed directly on the gate oxide.

3. The method, according to claim 1, wherein depositing the metal layer includes depositing a refractory metal directly on the gate oxide to serve as the second gate material subsequent to removal of the first gate material.

4. The method, according to claim 1, wherein the second gate material and the metal layer are the same material.

5. The method, according to claim 1, wherein forming the transistor on the semiconductor substrate includes forming the source region and the drain region using a self-aligned process.

6. A method for forming a semiconductor device, the method comprising:

forming a transistor on a semiconductor substrate, including forming as part of the transistor a first gate material with opposing sides directly on a gate oxide on the substrate, source and drain regions, and a pair of dielectric spacers adjacent to the opposing sides of the first gate material, the first gate material being selective to the gate oxide and to the dielectric spacers, including using a self-aligned process to form the source and drain regions;

forming a second metal material in place of the first gate material, the second metal material being different from the first gate material and coupling to and over the source and drain regions.

7. The method, according to claim 6, wherein forming a second metal material includes removing the first gate material before forming the second metal material.

8. The method, according to claim 6, wherein using a self-aligned process to form the source and drain regions includes using at least one of the first gate material and the spacers as a mask.

9. The method, according to claim 6, wherein using a self-aligned process to form the source and drain regions includes using the first gate material and the spacers as a mask.

10. The method, according to claim 9, further including forming refractory metal silicides within the source and drain regions.

11. The method, according to claim 8, wherein forming the second metal material in place of the first gate material includes forming the second metal material using a refractory metal.

12. A method for forming a semiconductor device, the method comprising:

forming a transistor on a semiconductor substrate, including forming a first gate material with opposing sides directly on a gate oxide on the substrate, a source region, a drain region, and a pair of dielectric spacers adjacent to the opposing sides of the first gate material, the first gate material being selective to the gate oxide and to the dielectric spacers;

replacing the first gate material with a second gate material; and depositing a metal layer electrically coupled to and over the source and drain regions.

13. The method of claim 12 wherein depositing the metal layer includes depositing a refractory metal directly on the gate oxide to serve as the second gate material subsequent to removal of the first gate material.

14. The method of claim 12 further comprising forming the first gate material using a nitride chemistry.

15. The method of claim 12 wherein depositing the metal layer includes depositing a refractory metal directly on the gate oxide and on the source and drain regions to serve as the second gate material.

16. The method of claim 12 wherein depositing the metal layer electrically coupled to and over the source and drain regions includes depositing titanium nitride (TiN).

17. The method of claim 12 wherein forming the source and the drain regions further includes forming, respectively, a lightly doped drain region and a lightly doped source region underneath the pair of dielectric spacers.

18. The method of claim 12 wherein replacing the first gate material includes performing a reactive ion etch (RIE).

19. The method of claim 12 wherein forming the source and drain regions includes using the first gate material and the dielectric spacers as a mask to produce self-aligned source and drain regions.

20. The method of claim 12 wherein depositing the metal layer electrically coupled to and over the source and drain regions includes forming refractory metal silicides within the source and drain regions.

* * * * *

UNITED STATES PATENT AND TRADEMARK OFFICE
CERTIFICATE OF CORRECTION

PATENT NO. : 6,051,486

DATED : April 18, 2000

INVENTOR(S): Gardner

It is certified that error appears in the above-identified patent and that said Letters Patent is hereby corrected as shown below:

On the Title Page

In the heading, the name of the Assignee should read Advanced Micro Devices.

Signed and Sealed this

Seventeenth Day of April, 2001

*Attest:*

NICHOLAS P. GODICI

*Attesting Officer*     *Acting Director of the United States Patent and Trademark Office*